United States Patent
Ang et al.

(10) Patent No.: US 6,284,609 B1
(45) Date of Patent: Sep. 4, 2001

(54) METHOD TO FABRICATE A MOSFET USING SELECTIVE EPITAXIAL GROWTH TO FORM LIGHTLY DOPED SOURCE/DRAIN REGIONS

(75) Inventors: Ting Cheong Ang, Singapore (SG); Shyue Fong Quek, Petaling Jaya; Puay Ing Ong, Kluang Johor, both of (MY); Sang Yee Loong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/435,437

(22) Filed: Nov. 22, 1999

(51) Int. Cl.[7] .................................. H01L 21/336
(52) U.S. Cl. .................. 438/300; 438/197; 438/299; 438/489; 438/607
(58) Field of Search ................... 438/300, 301, 438/303, 299, 197, 488, 491, 607, 489

(56) References Cited

U.S. PATENT DOCUMENTS

| | | | |
|---|---|---|---|
| 4,072,545 | * 2/1978 | De La Moneda | 156/643 |
| 4,419,810 | * 12/1983 | Riseman | 438/300 |
| 4,803,173 | * 2/1989 | Sill et al. | 438/300 |
| 5,200,352 | 4/1993 | Pfiester | 437/44 |
| 5,447,874 | 9/1995 | Grivna et al. | 437/40 |
| 5,856,225 | 1/1999 | Lee et al. | 438/29 |
| 6,214,680 | * 4/2001 | Quek et al. | 438/197 |

FOREIGN PATENT DOCUMENTS

359082768-A * 5/1984 (JP).

* cited by examiner

Primary Examiner—Michael Trinh
(74) Attorney, Agent, or Firm—George O. Saile; Rosemary L. S. Pike

(57) ABSTRACT

A new method of fabricating a sub-quarter micron MOSFET device is achieved. A semiconductor substrate is provided. Isolation regions are formed in this substrate. An oxide layer is provided overlying both the substrate and the isolation regions. The oxide layer is patterned and etched exposing two regions of the substrate. A selective epitaxial growth (SEG) is performed with in situ doping covering the two exposed substrate regions formed during the previous step. The doped SEG regions will form the source and drain contact regions of the MOSFET. The oxide layer region between the two doped SEG regions is then patterned and etched away exposing the substrate. This is followed by a gate oxide formation and either a polysilicon or metal gate deposition. Planarization is then performed on the surface to facilitate interconnection later in the process and to form the final gate structure. Thermal energy provided from processing steps or from a rapid thermal anneal (RTA) allows the doping atoms in the SEG regions to diffuse into the substrate thereby forming the active source/drain regions. This method allows precise control of the doping profile in the active source/drain region. An interlevel dielectric is then deposited over the entire surface. Contact holes are then etched in the interlevel dielectric and metalization patterned to allow interconnection to the completed MOSFET device.

27 Claims, 3 Drawing Sheets

US 6,284,609 B1

METHOD TO FABRICATE A MOSFET USING SELECTIVE EPITAXIAL GROWTH TO FORM LIGHTLY DOPED SOURCE/DRAIN REGIONS

RELATED PATENT APPLICATION

U.S. patent application Ser. No. 09/460,111, now U.S. Pat. No. 6,214,680 to the same inventors, filed on Dec. 13, 1999.

BACKGROUND OF THE INVENTION (1) Field of the Invention

The invention relates to the method of fabrication of integrated circuit devices, and more particularly, to a method of forming a sub-quarter-micron MOSFET structure with a raised source and drain in the fabrication of integrated circuits.

(2) Description of the Prior Art

In sub-quarter-micron MOSFET architecture, it is necessary to use ultra-shallow source and drain regions. Low energy ion implantation is typically used to form such regions.

For example, FIG. 1 illustrates a semiconductor substrate 10, preferably composed of monocrystalline silicon. A layer of silicon oxide 12 is formed on the surface of the substrate. A polysilicon layer is deposited and patterned to form gate electrode 16. A typical LDD (lightly doped source and drain) structure is formed by an LDD mask implant followed by spacer oxide deposition and etching and then a source/drain mask implant. Lightly doped source and drain regions 20 are shown in FIG. 1.

U.S. Pat. No. 5,200,352 to Pfiester teaches a method of forming a MOSFET device using raised epitaxial regions adjacent to lightly doped substrate source/drain regions allowing precise control of the source/drain region doping profiles. U.S. Pat. No. 5,447,874 to Grivna et al teaches a method of forming an MOSFET device using a dual metal gate formed in an oxide opening. Using a chemical mechanical polishing step to planarize the surface eliminates the problems encountered in etching different metals. U.S. Pat. No. 5,856,225 to Lee et al teaches of forming an MOSFET device where the source/drain regions are built prior to the implantation of the channel region under the gate. This allows more precise control of the source/drain positions, thereby controlling the electrical parameters of the MOSFET device.

SUMMARY OF THE INVENTION

A principal object of the present invention is to provide an effective and very manufacturable method of fabricating a sub-quarter-micron MOSFET device having a raised source/drain structure.

Another object of the present invention is to provide a method of fabricating a sub-quarter-micron MOSFET device having a raised source/drain structure using selective epitaxial growth (SEG).

Yet another object of the present invention is to provide a method of fabricating a sub-quarter-micron MOSFET device having an LDD structure wherein the source/drain dopant concentrations are precisely controlled.

In accordance with the objects of this invention, a new method of fabricating a sub-quarter micron MOSFET device is achieved. A semiconductor substrate is provided. Shallow-trench isolation (STI) regions, for example, are formed in this substrate. An oxide layer is provided overlying both the substrate and the STI regions. The oxide layer is patterned and etched exposing two regions of the substrate. A selective epitaxial growth (SEG) is performed with in situ doping covering the two exposed substrate regions formed during the previous step. The doped SEG regions will form the source and drain contact regions of the MOSFET. The oxide layer region between the two doped SEG regions is then patterned and etched away exposing the substrate between the two doped SEG regions. This is followed by a gate oxide formation and either a polysilicon or metal gate deposition. Chemical mechanical polishing (CMP), for example, is then performed to planarize the surface to facilitate interconnection later in the process and forming the final gate structure. Thermal energy provided from processing steps or from a rapid thermal anneal (RTA) allows the doping atoms in the SEG regions to diffuse into the substrate forming the LDD regions. This method allows precise control of the doping profile in the LDD regions. An interlevel dielectric is then deposited over the entire surface. Contact holes are then etched in the interlevel dielectric and metalization patterned to allow interconnection to the completed MOSFET device.

BRIEF DESCRIPTION OF THE DRAWINGS

In the accompanying drawings forming a material part of this description, there is shown:

FIGS. 2 through 5 schematically illustrate in cross-sectional representation a preferred embodiment of the present invention. FIGS. 2 and 3 illustrate the first steps for both embodiments of the device.

DESCRIPTION OF THE PREFERRED EMBODIMENTS

Figure 1:
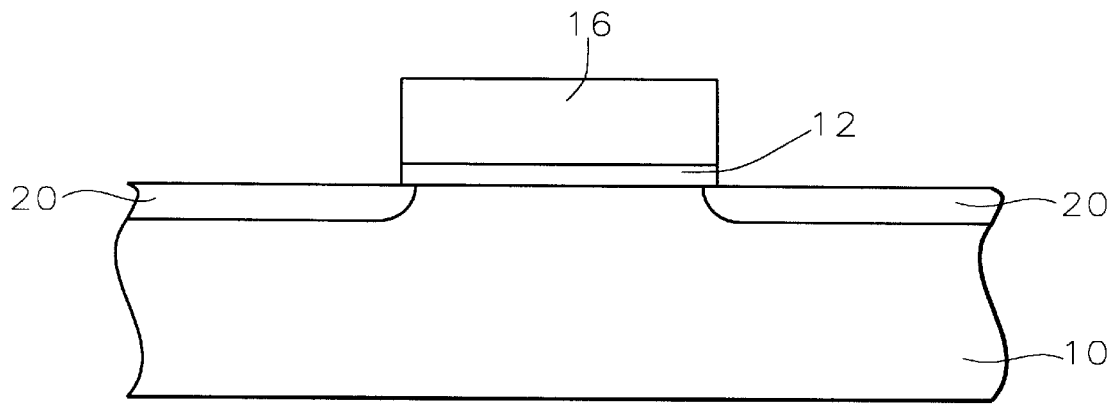
FIG. 1 schematically illustrates in cross-sectional representation a MOSFET having an LDD structure in accordance with prior art.
Figure 2:
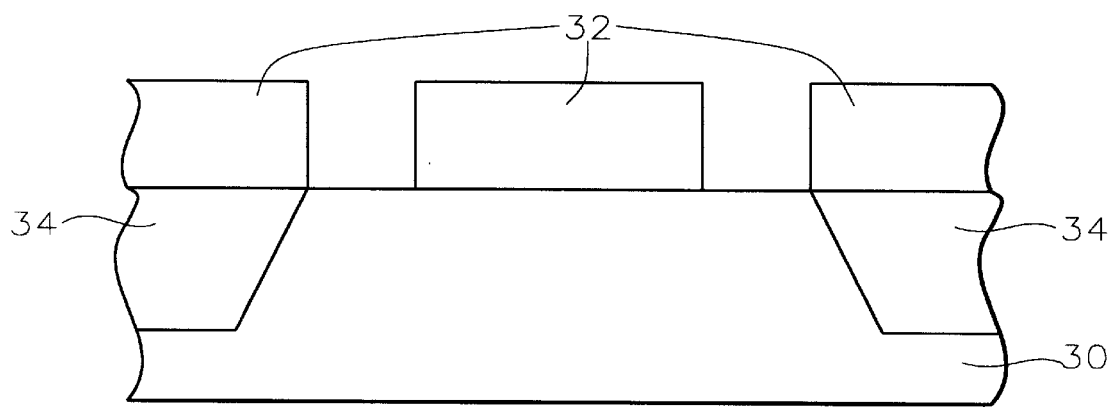
Figure 3:
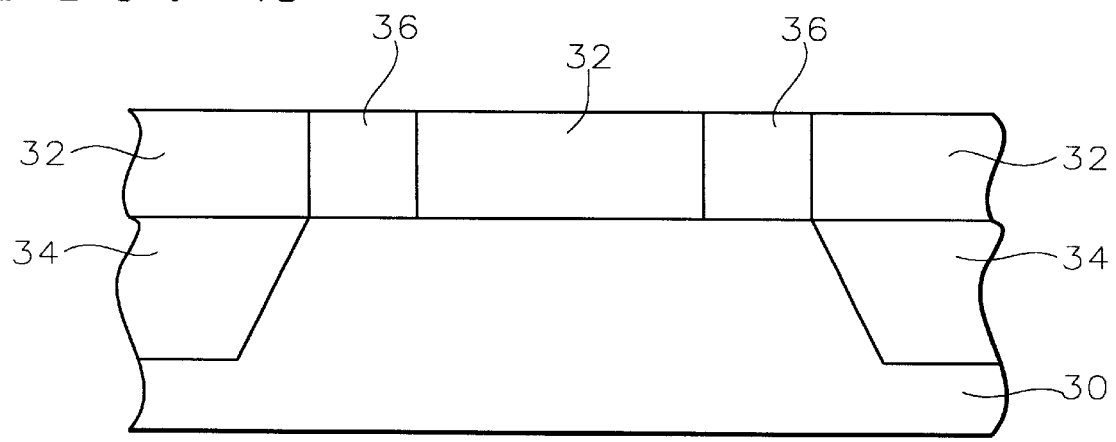

Without unduly limiting the scope of the invention, two preferred embodiments will be described herein. Referring now more particularly to FIG. 2, there is illustrated a portion of a partially completed MOSFET device. Semiconductor substrate 30 is preferably composed of monocrystalline silicon. Isolation regions such as shallow-trench isolation (STI) regions 34 are formed in the semiconductor substrate 30 to isolate active regions from one another. A dielectric layer 32 of thickness between about 1500 to 3000. Angstoms is grown or deposited. The dielectric layer 32 may comprise any dielectric material such as silicon oxide, silicon oxynitride, silicon nitride, and tetraethyl-oxysilane (TEOS). The dielectric layer 32 is patterned to expose the surface of the substrate 30 in the two areas of an active region Referring now to FIG. 3, a doped epitaxial region 36 is grown using selective epitaxial growth (SEG) on the area of the substrate not covered by the dielectric layer 32 to a thickness approximately equal to the thickness of the dielectric layer 32. The in-situ doping process occurs by introducing gasses during SEG with dopant atoms such as boron, phosphorous, arsenic, antimony, or indium at a concentration of between about 1E14 to 8E15 atoms/cm$^3$. The doped epitaxial regions 36 form raised source/drain regions.

Figure 4A:
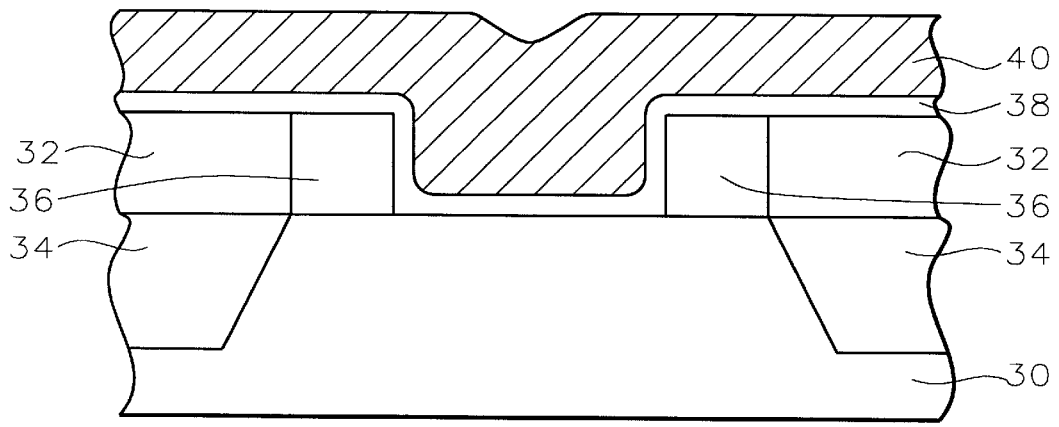
FIGS. 4a and 5a illustrate the completion of one embodiment of the device using a polysilicon gate.

Referring now to FIG. 4a, of the first embodiment wherein a polysilicon gate is used. The area of dielectric layer 32 between the two epitaxial regions 36 is etched away. A gate oxide 38 is then conformally deposited by rapid thermal oxidation (RTO), low-pressure chemical vapor deposition (LCVD) or furnace oxidation over the entire surface with a thickness of between about 10 to 200 Angstroms. This is followed by a deposition of a gate layer 40 with a thickness of between about 1500 to 3000 Angstroms. This gate layer 40 may be composed of polysilicon, polysilicon germanium, amorphous silicon, platinum silicon germanium, or a stacked composite having one layer of polysilicon and a second layer of polysilicon germanium or a conducting metal such as tungsten, aluminum or titanium. When a stacked composite gate layer 40 is used, the deposition method is furnace oxide, chemical vapor deposition (CVD), low pressure CVD (LPCVD), or rapid thermal CVD (RTCVD). The first layer of the composite will have a thickness of between about 500 to 2000 Angstroms, and the second layer will have a thickness of between about 1000 to 2500 Angstroms.

Figure 5A:
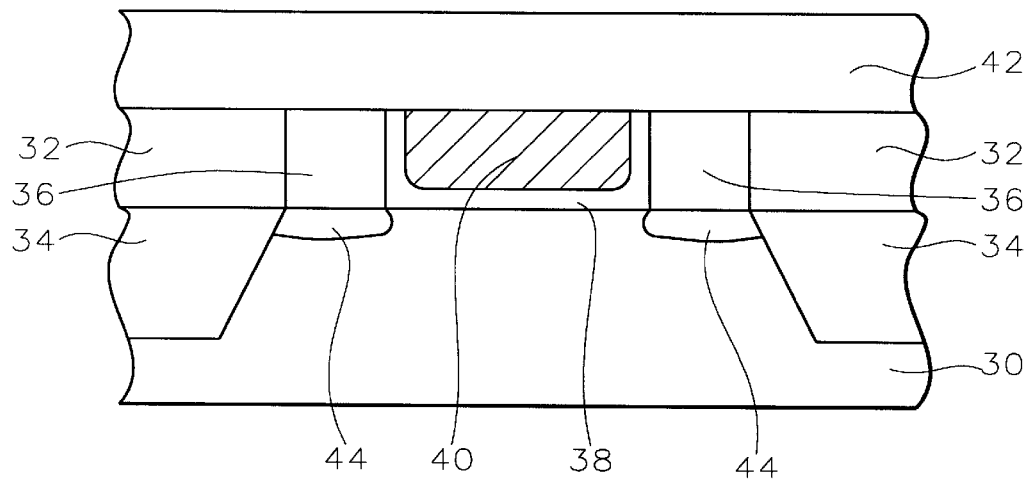

Referring now to FIG. 5a, the surface is then planarized using chemical mechanical polishing (CMP), for example, leaving the gate oxide 38 and the conducting gate layer 40 only in the regions between the two epitaxial regions 36. A rapid thermal annealing (RTA) step of duration between about 5 to 60 seconds at a temperature between about 800 to 1150° C. is then performed. This activates dopant atoms that diffused from the epitaxial region 36 into the substrate 30 forming the lightly doped source/drain (LDD) regions 44. An interlevel dielectric layer 42 is then deposited overlying the entire surface of the semiconductor. Contact holes (not shown) and metal interconnection lines (not shown) would then be patterned to make connections to the completed MOSFET device.

Figure 4B:
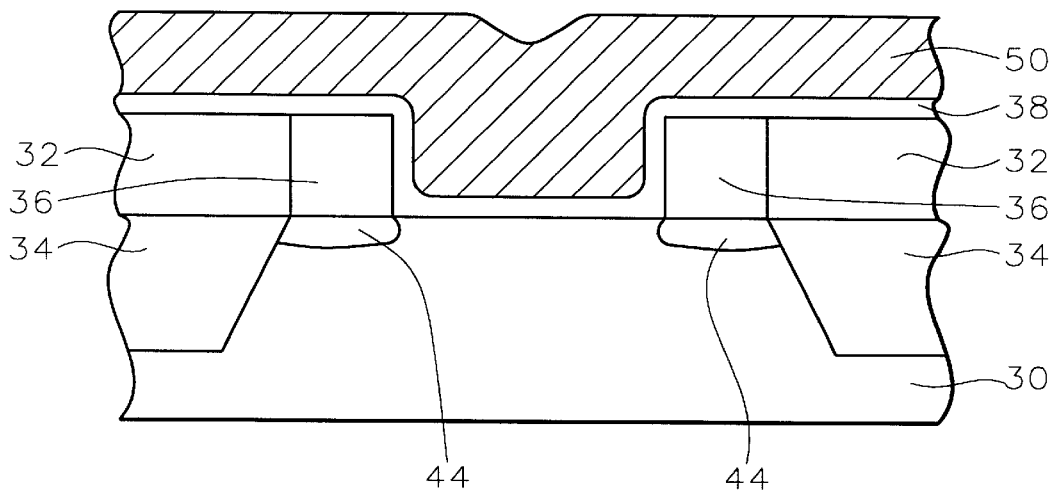
FIGS. 4b and 5b illustrate the completion of a second embodiment of the device using a metal gate.
Figure 5B:
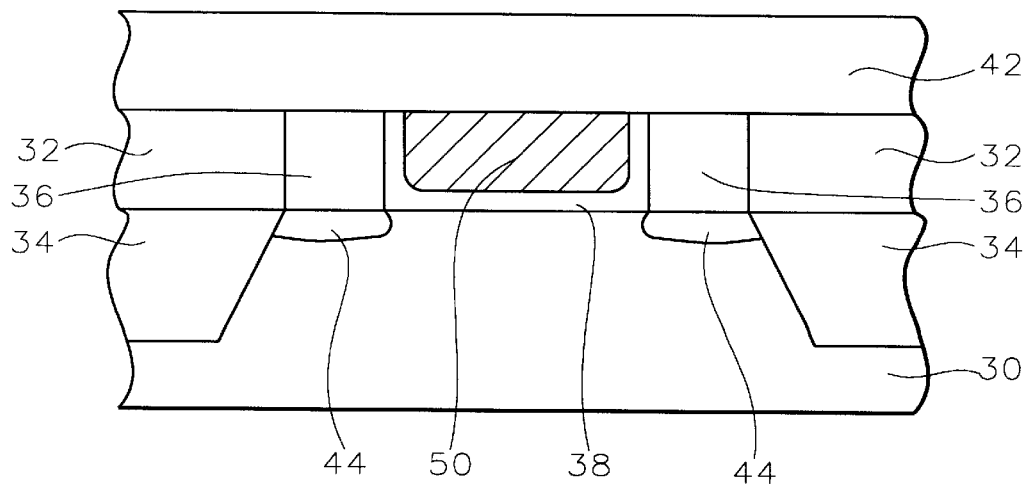

Refer now to FIG. 4b, describing a second embodiment wherein a metal gate is used. The area of dielectric layer 32 between the two epitaxial regions 36 is etched away. A gate oxide 38 is then grown or deposited by rapid thermal oxidation (RTO), low-pressure chemical vapor deposition (LPCVD) or furnace oxidation over the entire surface with a thickness of between about 10 to 200 Angstroms. A temperature between about 800 to 1150° C. for between about 5 to 60 seconds would be used for RTO. Using a furnace growth, would require a temperature of between about 800 to 1150° C. for between about 10 to 120 minutes. The thermal energy used in this gate oxide 38 formation activates dopant atoms diffused from the epitaxial region 36 into the substrate 30 forming the LDD regions 44. This is followed by a deposition of a metal gate layer 50 with a thickness of between about 1500 to 3000 Angstroms. This metal gate layer 50 may be composed of any conducting metal, a stacked composite having one layer of polysilicon and a second layer of a conducting metal, or a composite made up of layers of conductors and/or conducting metals. Possible conducting metals may include tungsten, aluminum or titanium. When a stacked composite gate layer 50 is used, the deposition method will include furnace oxide, chemical vapor deposition (CVD), low pressure CVD (LPCVD), or rapid thermal CVD (RTCVD). The first layer of the composite will have a thickness of between about 500 to 2000 Angstroms, and the second layer will have a thickness of between about 1000 to 2500 Angstroms Referring now to FIG. 5b, the surface is then planarized using CMP leaving the gate oxide 38 and the metal gate layer 50 only in the regions between the two epitaxial regions 36. A rapid thermal annealing (RTA) step of duration between about 5 to 60 seconds at a temperature between about 800 to 1150° C. may be performed to continue the activation of dopant atoms diffused from the epitaxial region 36 into the substrate 30 to complete the formation of the LDD regions 44. An interlevel dielectric layer 42 is then deposited overlying the entire surface of the semiconductor. Contact holes (not shown) and metal interconnection lines (not shown) would then be patterned to make connections to the completed MOSFET device.

The present invention provides a method of fabricating a sub-quarter-micron MOSFET device having raised source/drain. In addition, the method provided uses self-aligning structures simplifying the manufacturing process and providing for consistent physical dimensions and electrical device characteristics. Since no dry plasma etching of the gate is required in the process, there is no plasma-induced damage induced during the gate patterning and formation.

While the invention has been particularly shown and described with reference to the preferred embodiments thereof, it will be understood by those skilled in the art that various changes in form and details may be made without departing from the spirit and scope of the invention.

What is claimed is:

1. A Method of fabricating an integrated circuit device comprising:

providing an active area in a semiconductor substrate separated from other active areas by isolation regions;

forming a dielectric layer overlying said semiconductor substrate and said isolation regions;

patterning and etching away said dielectric layer in two distinct areas and within said active area to form two openings to said semiconductor substrate;

growing a doped silicon region to fill each of said openings wherein said doped silicon regions form raised source and drain regions;

etching away said dielectric layer in said active area between said doped silicon regions forming a gate opening to said semiconductor substrate;

conformally growing a gate oxide layer within said gate opening and overlying said dielectric layer and said doped silicon regions;

depositing a conducting layer overlying said gate oxide layer and filling said gate opening;

planarizing said conducting layer to complete formation of a gate electrode;

thermally diffusing dopant atoms from each of said doped silicon regions into said substrate underlying said doped silicon regions to form lightly doped regions; and depositing an interlevel dielectric layer overlying said gate electrode completing fabrication of said integrated circuit device.

2. The method according to claim 1 wherein said isolation regions are formed by shallow trench isolation (STI).

3. The method according to claim 1 wherein said dielectric layer comprises one of a group containing silicon oxide, silicon oxynitride, silicon nitride, and tetraethyloxysilane (TEOS) deposited to a thickness of between about 1500 to 3000 Angstroms.

4. The method according to claim 1 wherein said growing of said doped silicon region is performed using in-situ doped selective epitaxial growth (SEG).

5. The method according to claim 1 wherein said doped silicon region is doped with one of a group containing boron, arsenic, phosphorous, indium and antimony at a concentration of between about 1E14 to 8E15 atoms/cm$^3$.

6. The method according to claim 1 wherein said gate oxide layer is formed to a thickness of between about 10 to 200 Angstroms.

7. The method according to claim 1 wherein said conducting layer comprises one or more of a group containing polysilicon, polysilicon germanium, amorphous silicon, platinum silicon germanium, tungsten, aluminum and titanium deposited to a thickness of between about 1500 to 3000 Angstroms.

8. The method according to claim 1 wherein said thermal diffusion is performed using rapid thermal annealing (RTA) at a temperature of between about 800 to 1150° C. for a period of between about 5 to 60 seconds.

9. The method according to claim 1 wherein said thermal diffusion occurs during said step of growing said gate oxide layer.

10. Method of fabricating an integrated circuit device comprising:

provilang an active area in a semiconductor substrate separated from other active areas by isolation regions;

forming a dielectric layer overlying said semiconductor substrate and said isolation regions;

patterning and etching away said dielectric layer in two distinct areas and within said active area to form two openings to said semiconductor substrate;

growing a doped silicon region to fill each of said openings wherein said doped silicon regions form raised source and drain regions;

etching away said dielectric layer in said active area between said doped silicon regions forming a gate opening to said semiconductor substrate;

conformally growing a gate oxide layer within said gate opening and overlying said dielectric layer and said doped silicon regions;

depositing a silicon layer overlying said gate oxide layer and filling said gate opening;

planarizing said silicon layer to complete formation of a gate electrode;

thermally diffusing dopant atoms from each of said doped silicon regions into said substrate underlying said doped silicon regions to form lightly doped regions; and depositing an interlevel dielectric layer overlying said gate electrode completing fabrication of said integrated circuit device.

11. The method according to claim 10 wherein said isolation regions are formed by shallow trench isolation (STI).

12. The method according to claim 10 wherein said dielectric layer comprises one of a group containing silicon oxide, silicon oxynitride, silicon nitride, and tetraethyloxysilane (TEOS) deposited to a thickness of between about 1500 to 3000 Angstroms.

13. The method according to claim 10 wherein said growing of said doped silicon region is performed using in-situ doped selective epitaxial growth (SEG).

14. The method according to claim 10 wherein said doped silicon region is doped with one of a group containing boron, arsenic, phosphorous, indium and antimony at a concentration of between about 1E14 to 8E15 atoms/cm$^3$.

15. The method according to claim 10 wherein said gate oxide layer is formed to a thickness of between about 10 to 200 Angstroms.

16. The method according to claim 10 wherein said silicon gate electrode comprises one or more of a group containing polysilicon, polysilicon germanium, amorphous silicon, and platinum silicon germanium deposited to a thickness of between about 1500 to 3000 Angstroms.

17. The method according to claim 10 wherein said thermal diffusion is performed using rapid thermal annealing (RTA) at a temperature of between about 800 to 1150° C. for a period of between about 5 to 60 seconds.

18. The method according to claim 10 wherein said thermal diffusion occurs during said step of growing said gate oxide layer.

19. A method of fabricating an integrated circuit device comprising:

providing an active area in a semiconductor substrate separated from other active areas by isolation regions;

forming a dielectric layer overlying said semiconductor substrate and said isolation regions;

patterning and etching away said dielectric layer in two distinct areas and within said active area to form two openings to said semiconductor substrate;

growing a doped silicon region to fill each of said openings wherein said doped silicon regions form raised source and drain regions;

etching away said dielectric layer in said active area between said doped silicon regions forming a gate opening to said semiconductor substrate;

conformally growing a gate oxide layer within said gate opening and overlying said dielectric layer and said doped silicon regions;

depositing a metal layer overlying said gate oxide layer and filling said gate opening;

planarizing said metal layer to complete formation of a gate electrode;

thermally diffusing dopant atoms from each of said doped silicon regions into said substrate underlying said doped silicon regions to form lightly doped regions; and depositing an interlevel dielectric layer overlying said gate electrode completing fabrication of said integrated circuit device.

20. The method according to claim 19 wherein said isolation regions are formed by shallow trench isolation (STI).

21. The method according to claim 19 wherein said dielectric layer comprises one of a group containing silicon oxide, silicon oxynitride, silicon nitride, and tetraethyloxysilane (TEOS) deposited to a thickness of between about 1500 to 3000 Angstroms.

22. The method according to claim 19 wherein said growing of said doped silicon region is performed using in-situ doped selective epitaxial growth (SEG).

23. The method according to claim 19 wherein said doped silicon region is doped with one of a group containing boron, arsenic, phosphorous, indium and antimony at a concentration of between about 1E14 to 8E15 atoms/cm$^3$.

24. The method according to claim 19 wherein said gate oxide layer is formed to a thickness of between about 10 to 200 Angstroms.

25. The method according to claim 19 wherein said metal gate electrodes comprises one of a group containing titanium, tungsten and aluminum deposited to a thickness of between about 1500 to 3000 Angstroms.

26. The method according to claim 19 wherein said thermal diffusion is performed using rapid thermal annealing (RTA) at a temperature of between about 800 to 1150° C. for a period of between about 5 to 60 seconds.

27. The method according to claim 19 wherein said thermal diffusion occurs during said step of growing said gate oxide layer.

* * * * *